(12) United States Patent
Hikita et al.

(10) Patent No.: US 6,525,624 B1
(45) Date of Patent: Feb. 25, 2003

(54) BAND-SWITCHABLE SURFACE ACOUSTIC WAVE ANTENNA DUPLEXER AND MOBILE RADIO TERMINAL

(75) Inventors: Mitsutaka Hikita, Kokubunji (JP); Nobuhiko Shibagaki, Kokubunji (JP); Kazuyuki Sakiyama, Mizusawa (JP); Masato Kijima, Mizusawa (JP); Osamu Hikino, Mizusawa (JP)

(73) Assignee: Hitachi Media Electronics Co., Ltd., Mizusawa (JP)

( * ) Notice: Subject to any disclaimer, the term of this patent is extended or adjusted under 35 U.S.C. 154(b) by 0 days.

(21) Appl. No.: 09/643,769

(22) Filed: Aug. 23, 2000

(30) Foreign Application Priority Data

Aug. 26, 1999 (JP) .......................................... 11-239171

(51) Int. Cl.[7] .............................. H03H 9/72; H03H 9/64
(52) U.S. Cl. ...................................... 333/133; 333/193
(58) Field of Search .......................... 333/133, 193–196

(56) References Cited

U.S. PATENT DOCUMENTS

| | | | | |
|---|---|---|---|---|
| 5,170,498 A | * | 12/1992 | Oto ........................ | 455/190.1 |
| 5,726,610 A | * | 3/1998 | Allen et al. ................. | 333/133 |
| 5,933,062 A | * | 8/1999 | Kommrusch ................ | 333/193 |
| 6,018,281 A | * | 1/2000 | Taguchi et al. ............. | 333/193 |
| 6,115,592 A | * | 9/2000 | Ueda et al. ................. | 455/307 |
| 6,285,559 B1 | * | 9/2001 | Fukiharu ................. | 333/186 X |
| 6,308,051 B1 | * | 10/2001 | Atokawa ..................... | 455/78 |

FOREIGN PATENT DOCUMENTS

| | | | | |
|---|---|---|---|---|
| EP | 1 035 648 A2 | * | 9/2000 | |
| JP | 5-235688 | * | 9/1993 | ................ 333/193 |
| JP | 9-83214 | * | 3/1997 | |
| JP | 2000-323961 | * | 11/2000 | |

\* cited by examiner

Primary Examiner—Barbara Summons
(74) Attorney, Agent, or Firm—Crowell & Moring LLP

(57) ABSTRACT

A surface acoustic wave antenna duplexer constituted by a transmitter-line filter, a receiver-line filter and an antenna terminal, the transmitter-line filter and the receiver-line filter being connected in parallel with the antenna terminal as a common terminal; wherein at least one of the transmitter-line and receiver-line filters includes a top filter using the whole of a transmitter band or a receiver band as its pass band, a surface acoustic wave resonator filter, and a transmitter or receiver terminal, the top filter, the surface acoustic wave resonator filter and the transmitter or receiver terminal being disposed in this order viewed from the antenna terminal, the surface acoustic wave resonator filter including at least one additive capacitance or inductance; and wherein a switching element is provided for varying a value of the capacitance or inductance so as to provide a function for varying a pass band frequency or an attenuation band frequency of the surface acoustic wave resonator filter.

14 Claims, 16 Drawing Sheets

Antenna duplexer

BAND-SWITCHABLE SURFACE ACOUSTIC WAVE ANTENNA DUPLEXER AND MOBILE RADIO TERMINAL

BACKGROUND OF THE INVENTION

1. Field of the Invention

The present invention relates to a mobile radio terminal such as a portable telephone or the like for performing transmission/reception through a single antenna, or an antenna duplexer using a surface acoustic wave (hereinafter referred to as SAW) which is suitable for such a mobile radio terminal.

2. Background Art

An antenna duplexer is configured such that a transmitter-line filter 2 and a receiver-line filter 3 are connected in parallel to each other through an antenna terminal 1 as a common terminal, as shown in FIG. 1. A background-art antenna duplexer was constituted by using transmitter-line and receiver-line filters in which a large number of coaxial dielectric resonators were connected in cascade, for example, as described in "How dielectric filter technologies respond to requirements of future communication systems", 1998 Asia-Pacific Microwave Conference Proceedings, pp.1445–1452.

The mobile communication represented by portable telephone commenced its service in an analog system for transmitting: only voice. After that, a digital system which could also transmit data started and has been continuing up to the present in some locations. In addition, to these systems, a CDMA (Code Division Multiple Access) system as well as these systems has been already introduced. The CDMA system has superior features such as message screening from eavesdrop, soft hand over, and so on, and it is said that the CDMA system will account for about half of all the mobile communications in the middle of the 21th century.

FIG. 2 is a block diagram of a mobile radio terminal. An antenna duplexer 4 is configured such that a transmitter-line filter 2 and a receiver-line filter 3 are connected in parallel to each other through an antenna terminal 1 as a common terminal, as shown in FIG. 1. With this configuration, the antenna duplexer separates very high transmitted power (usually 0.2 W to 1 W) in a transmitter band from a transmitter (here designating a portion from a modulator (Mod.) to a high power amplifier (HPA) 7) and very weak received power (usually about –100 dB to –150 dB of the transmitted power) in a receiver band coming in through an antenna, and sends the former to the antenna and receives the latter to the receiver (here designating a portion from a low noise amplifier (LNA) 8 to a demodulator (Demod.)).

One of large differences between the digital system and particularly the CDMA system is that transmission and reception are not performed simultaneously in the digital system because a burst-like. transmission signal and a burst-like reception signal are shifted from each other on the time base while transmission and reception are always performed simultaneously in the CDMA system. In the digital system, therefore, even if a part of transmitted power wanders into a receiver side, there is little influence on the characteristics of the receiver as long as an LNA of the receiver is not broken.

In the CDMA system, on the other hand, transmission and reception are performed simultaneously. It is therefore necessary for a receiver-line filter of an antenna duplexer to suppress transmitted power satisfactorily so as to sufficiently restrain the transmitted power from entering a receiver side. That is, the receiver-line filter should have a large quantity of attenuation in the transmitter band. In addition, noise generated from an HPA in the receiver band and superposed on received weak power from an antenna is put into the receiver. The sensitivity characteristics of the receiver deteriorate thus. It is therefore necessary for a transmitter-line filter of the antenna duplexer to suppress the receiver band noise from the HPA satisfactorily. That is, the transmitter-line filter should have a large quantity of attenuation in the receiver band.

Generally, in transmitter-line and receiver-line filters of an antenna duplexer, as the bandwidth of each of the transmitter and receiver bands is broader, and as the space (guard band) between the transmitter and receiver bands is narrower, it is more difficult to attain frequency characteristics required of the filter. In recent portable telephones, there is a tendency to make the bandwidth of each of the transmitter and receiver bands as wide as possible so as to ensure a large number of talk channels, and to make the guard band between the transmitter and receiver bands as narrow as possible so as to use the frequency effectively. Such a tendency is generally conspicuous particularly in the latest systems such as portable telephones using CDMA.

FIGS. 3A and 3B show the frequency allocation (FIG. 3A) of J-CDMA (!Japan CDMA) served for CDMA portable telephones in Japan and the frequency allocation (FIG. 3B) of PCS (Personal Communication System) served for CDMA portable telephones in the U.S, by way of example. In J-CDMA, the guard band is 17 MHz, and each of the transmitter and receiver bandwidths is 38 MHz including a null frequency bandwidth of 14 MHz. How wide each of the transmitter and receiver bandwidths is and how narrow the guard band is in this frequency allocation will be understood easily from the following comparative example. For example, in the frequency layout of well-known 800 MHz band portable telephone AMPS (Advanced Mobile Phone Service) in the U.S., the transmitter bandwidth is 25 MHz, that is, from 824 MHz to 849 MHz, the receiver bandwidth is also 25 MHz, that is, from 869 MHz, to 894 MHz, and the guard band is 20 MHz. In comparison therewith, in J-CDMA, each bandwidth increases by 52% and the guard band decreases by 18%.

In PCS: which uses a 1.9 GHz band, each of the transmission and receiver bandwidths is 60 MHz, and the guard band is 20 MHz. When the center frequency of PCS is scaled to the center frequency of AMPS, each bandwidth increases by 7% and the guard band decreases by 55%.

As has been described, particularly in a recent antenna duplexer for use in a radio terminal for CDMA or the like, severe requests are laid on the frequency characteristics of transmitter-line and receiver-line filters because transmission and reception are performed simultaneously. In addition, there is a request to broaden each of the transmitter and receiver bandwidths and to narrow the guard band. Thus, the fact is that it is very difficult to realize an antenna duplexer having properties satisfying all the requests.

In a background-art filter configuration in which a large number of coaxial dielectric resonators are connected in cascade, the number of stages of the dielectric resonators is increased to cope with such difficulty. However, the increase in the number of the stages results in increase of the volume of the antenna duplexer itself. As a result, the antenna duplexer becomes a largest and heaviest device in a recent CDMA terminal so as to place hurdles on the miniaturization of the terminal as a whole.

SUMMARY OF THE INVENTION

It is therefore an object of the present invention to solve the foregoing problems.

It is another object of the present invention to provide an antenna duplexer which is micro-miniaturized and reduced in weight, and hence to contribute to the miniaturization of a radio terminal as a whole.

In order to attain the foregoing objects, at least one of transmitter-line and receiver-line filters of an antenna duplexer is constituted by two partial filters connected in cascade. Of the partial filters, the antenna terminal side filter is referred to as a top filter. A surface acoustic wave (SAW) resonator filter is used as the transmitter-line or receiver-line terminal side partial filter. The top filter is required to have a frequency characteristics similar to those of an antenna duplexer used in a digital-system radio terminal. That is, the quantity of attenuation in each of the transmitter and receiver lines may be sufficiently small in the other's band It is known that an SAW resonator filter can realize a very low loss in the pass band, that is, allow-loss characteristic, when a narrow-band filter is made of the SAW resonator filter. In addition; the SAW resonator filter has another advantageous characteristics that a very large quantity of attenuation can be attained: at a specific frequency. We have found that if an SAW resonator filter is constituted by a combination of at least one SAW resonator and at least one additive capacitance or inductance, and if the value of the capacitance or inductance is varied by a switching element, the frequency of the pass band or the frequency of the attenuation band can be varied. This means that band switching can be attained by the SAW resonator filter.

Generally, SAW filters or SAW resonators can be implemented in the form of chips in the same manner as semiconductor ICs so as to be extremely small both in volume and in weight. Therefore, even including such additive capacitance or inductance and further including such a switching element and so on, the above-mentioned band-switchable SAW resonator filter can be miniaturized sufficiently.

As has been described, according to the present invention, a transmitter- line or receiver- line filter of an antenna duplexer is constituted by a top filter and a band-switchable SAW resonator filter which are connected in cascade so as to cover all the transmitter,or receiver bandwidth equivalently through changing over the band by switching and, at the same time, so as to such ensure a required quantity of attenuation by the composition of the top filter and the SAW resonator filter. Here, the top filter may be a background-art filter in which a large number of coaxial dielectric resonators are connected in cascade, or may be an SAW filter that has performance equal to that of the dielectric resonator filter and that is disclosed for example in "SAW antenna duplexer module using SAW-resonator-coupled filter for PCN systems", 1998 IEEE Ultrasonics Symposium Proceedings, pp.13–16. As a result of linear calculation, it was found that the volume could be made not larger than ½ of that of the background-art when each of the transmitter-line and receiver-line filters was constituted by cascade connection of a dielectric resonator filter as a top filter and a band-switchable SAW resonator filter according to the present invention. In addition, it was found that the volume could be made to be one to several of that in the background-art when each of the transmitter-line and receiver-line filters was constitutedby cascade connection of an SAW filter as a top filter, which had performance similar to the dielectric resonator filter, and a band-switchable SAW resonator filter according to the present invention.

DETAILED DESCRIPTION OF PREFERRED EMBODIMENTS

Embodiment 1

Figure 3A:
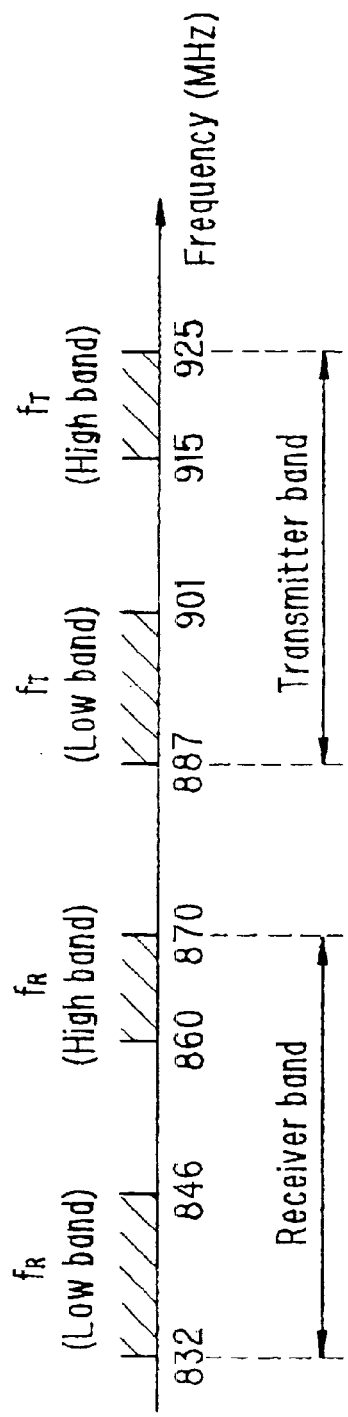
FIGS. 3A and 3B are views showing transmitter/receiver frequency layouts in Japan J-CDMA and in the U.S. PCS system, respectively.
Figure 4:
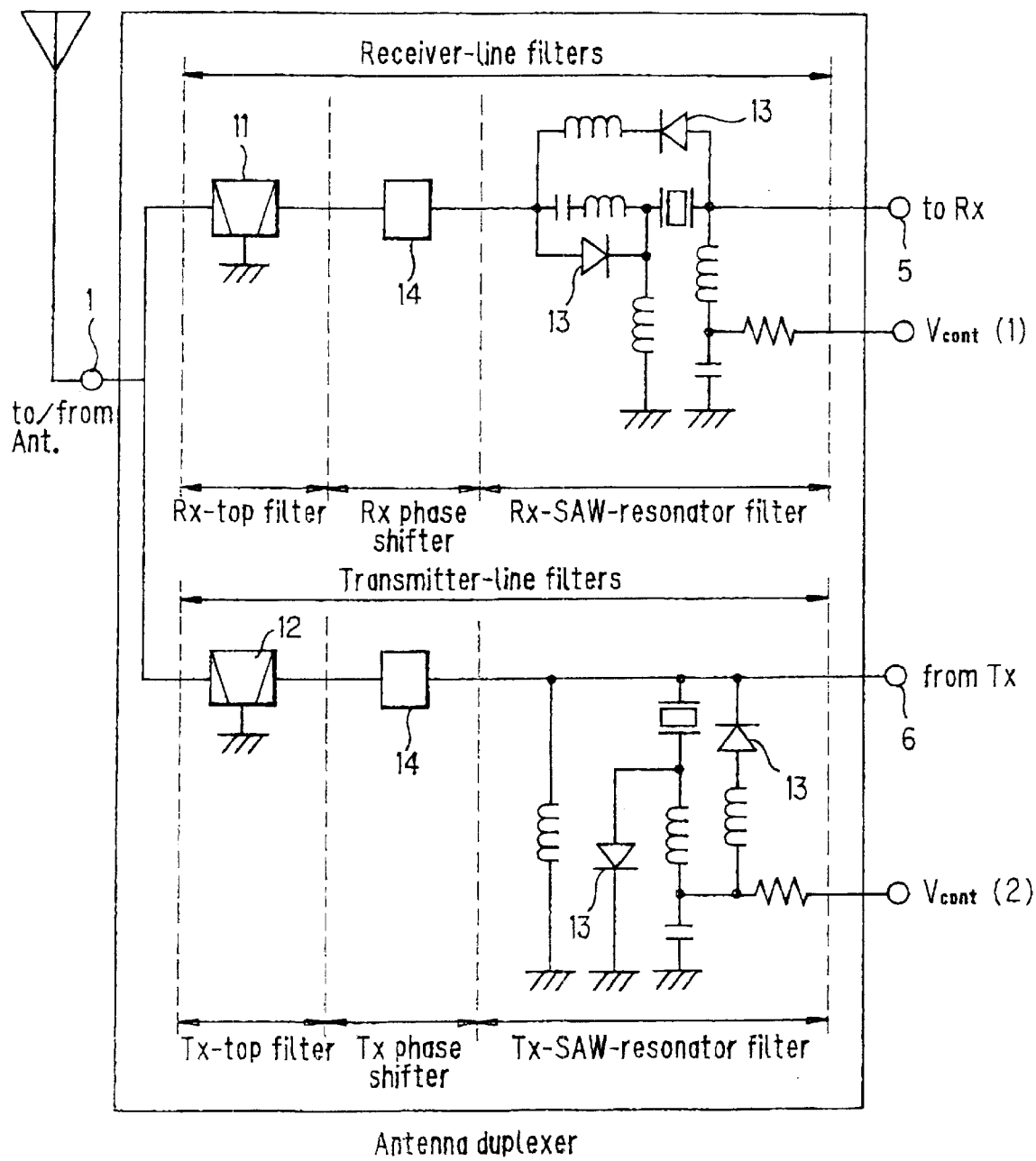
FIG. 4 is a block diagram of an antenna duplexer for a mobile radio terminal according to the present invention.

FIG. 4 shows one of fundamental embodiments of the present invention. FIG. 4 shows an antenna duplexer according to the present invention in the case where the frequency layout of J-CDMA shown in FIG. 3A is used by way of example. The receiver band (fR) is assigned to a low band (fR(L): 832 MHz to 846 MHz) of 14 MHz and a high band (fR(H): 860 MHz to 870 MHz) of 10 MHz putting an idle frequency band of 14 MHz therebetween, as described above in detail in Background Art. In the same manner, the transmitter band (fT) is assigned to a low band (fT(L): 887 MHz to 901 MHz) of 14 MHz and a high band (fT(H): 915 MHz to 925 MHz) of 10 MHz putting an idle frequency band of 14 MHz therebetween. The distance between the receiver and transmitter bands fR and fT, that is, the guard band is 17 MHz from 870 MHz to 887 MHz.

Figure 1:
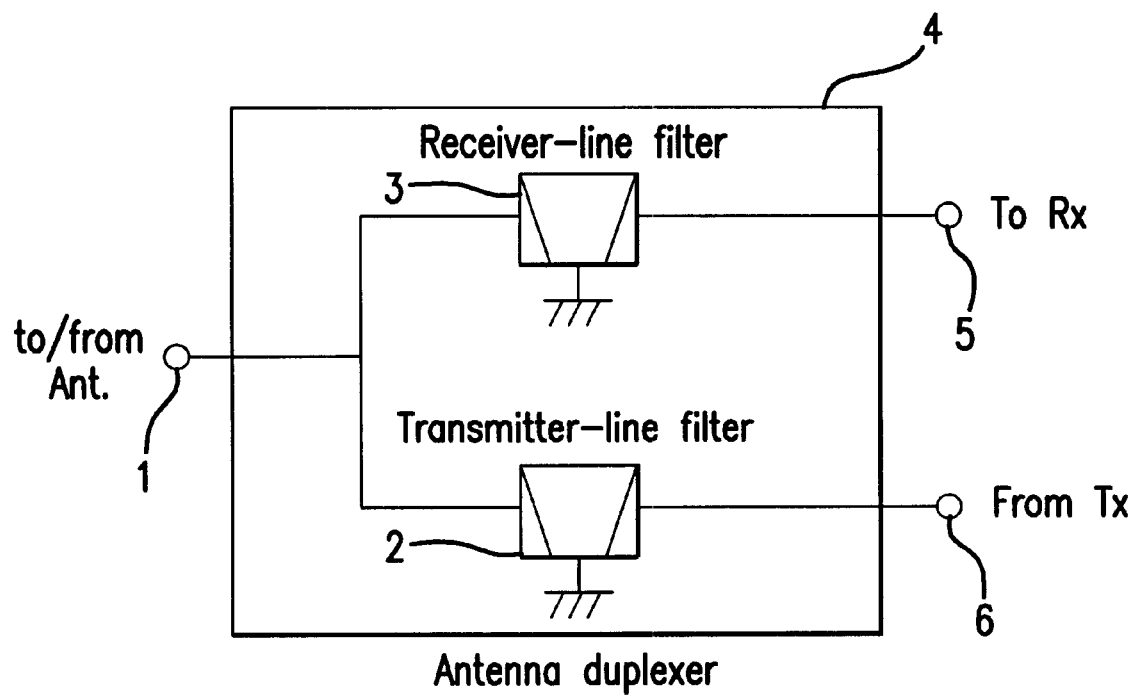
FIG. 1 is a block diagram of an antenna duplexer.
Figure 5:
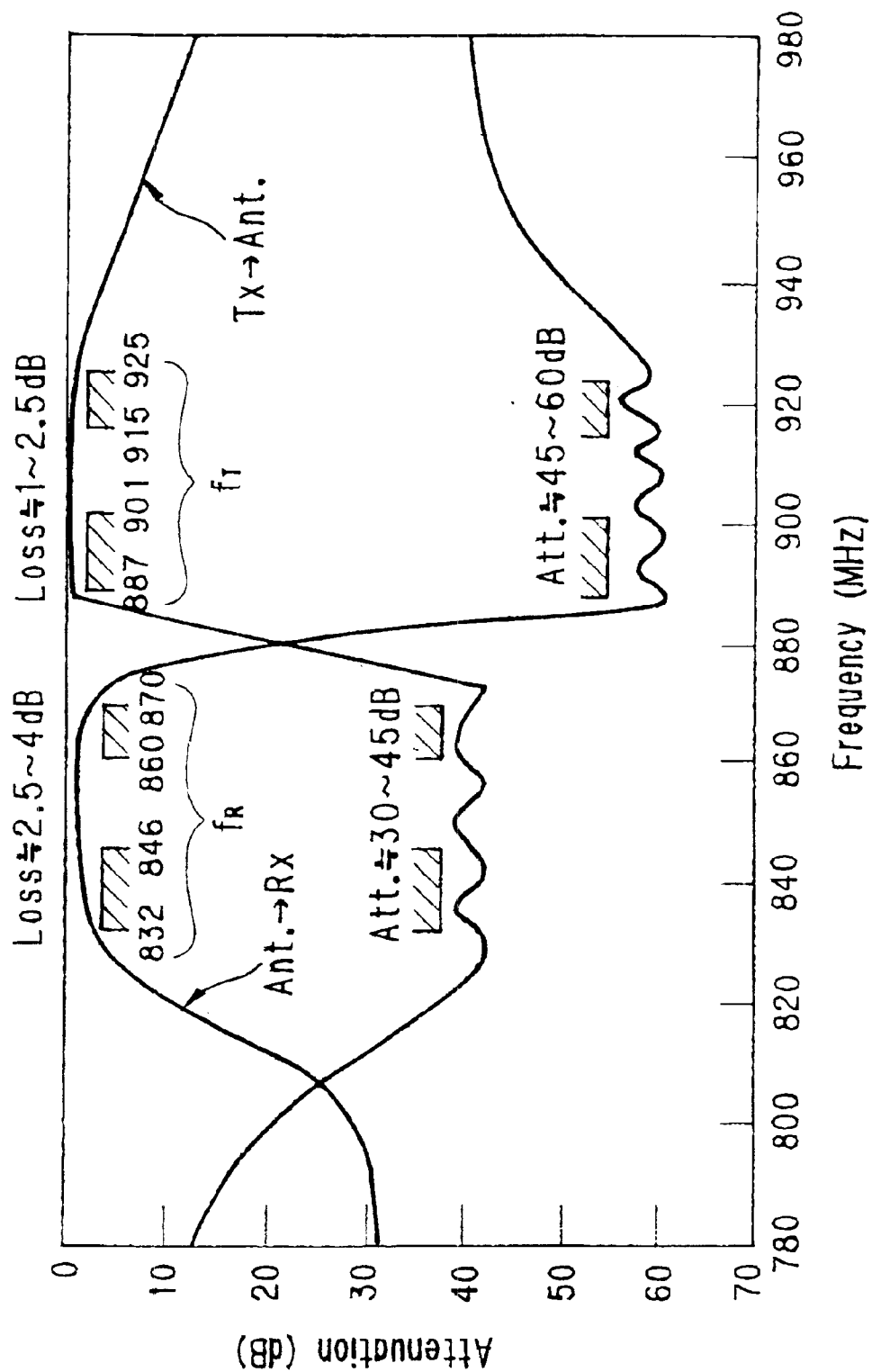
FIG. 5 is a diagram of a frequency characteristic required of a J-CDMA mobile radio terminal antenna duplexer.

FIG. 5 shows frequency characteristics required of an antenna duplexer with the background art configuration shown in FIG. 1. The characteristics of a transmitter-line filter, that is, the frequency characteristics between a receiver terminal 6 and an antenna terminal 1 (indicated by $T_x \rightarrow$ Ant in FIG. 5) are required so that ① they have low loss characteristics of about 1 to 2.5 dB in order not to attenuate high transmitted power of 0.2 to 1 W, and ② they have a large quantity of attenuation of about 30 to 45 dB in the receiver band in order to reduce noise in the same band which is generated in an HPA. On the other hand, the characteristics of a receiver-line filter, that is, the frequency characteristics between the antenna terminal 1 and a receiver terminal 5 (indicated by Ant. $\rightarrow R_x$ in FIG. 5) are required so that ① they have low loss characteristics of about 2.5 to 4 dB in order not to attenuate so largely received weak power which is smaller than the transmitted power by −100 to −150 dB, and ② they have a large quantity of attenuation of about 45 to 60 dB in the transmitter band in order to prevent the transmitted power from entering the receiver.

FIG. 4 shows an embodiment of the antenna duplexer according to the present invention, in which each of transmitter-line and receiver-line filters is constituted by a top filter and a band-switchable SAW resonator filter. Transmitter-line and receiver-line top filters (an $R_x$-top filter 11 and a $T_x$-top filter 12 in FIG. 4) are in parallel connection using the antenna terminal 1 as a common terminal. These filters maybe background-art dielectric resonator filters or SAW filters having performance similar to that of the dielectric resonator filters, as mentioned above in the paragraph of Background Art. One of the fundamental properties required of these filters is that the impedance of each filter has an enough large value in the other's band viewed from the common terminal, that is, the transmitter;top filter 12 has enough high impedance in the receiver band while the receiver top filter 11 has enough high impedance in the transmitter band. This allows the transmitter-line and receiver-line top filters to be in parallel connection using the antenna terminal 1 as their common terminal, as shown in FIG. 4.

Figure 6:
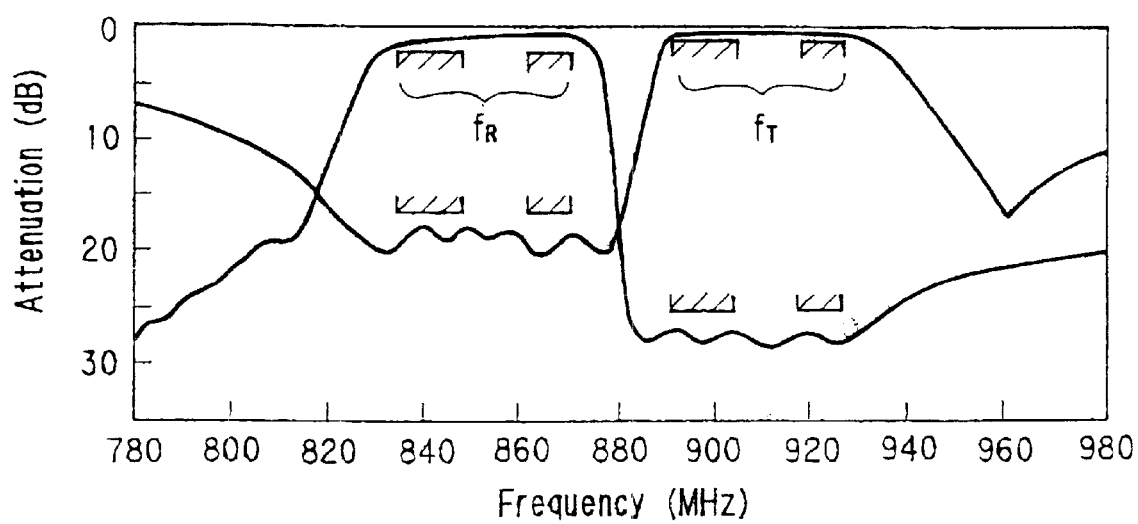
FIG. 6 is a diagram of frequency characteristics of transmitter and receiver top filters of the J-CDMA mobile radio terminal antenna duplexer.

FIG. 6 shows an example of the frequency characteristics required of the top filters. It is essential that the transmitter top filter 12 covers the whole of the transmitter band and the receiver top filter 11 covers the whole of the receiver band. In addition, the former should ensure a certain quantity of attenuation in the receiver band, and the latter should ensure a certain quantity of attenuation in the transmitter band. These quantities of attenuation are defined on the basis of spurious sensitivity specification or the like provided by the transmitted power and the system. Description will be made below about required values of the quantities of attenuation.

As shown in FIG. 4, the SAW resonator filter includes a switching element 13 such as a pin diode, a GaAs switch, or the like, for switching the band. The switching element 13 is a nonlinear element in itself so as to generate distortion depending on transmitted power. One of the largest influences of the distortion is a deterioration in sensitivity of the receiver. For example, the quantity of attenuation in the transmitter band of the receiver top filter 11 of FIG. 4 is therefore defined as follows. Here, the difference between the transmitter frequency (fT) and the receiver frequency (fR) is expressed by $\Delta f = fT - fR$. In addition, assume that a spurious signal (interfering wave) with $f_{sp} = fT + \Delta f$ comes in through the antenna. The transmitted power from the transmitter and the spurious signal from the antenna attenuated to some degree through the receiver top filter 11 enter the SAW resonator filter. Then, a signal at the frequency obtained by subtracting the frequency of the spurious signal from double of the transmitter frequency, that is, a signal at the frequency $2fT - f_{sp}$ is generated due to the 3rd-order nonlinear distortion of the switching element 13. From the relation of $2fT - f_{sp} = 2fT - (fT + \Delta f) = fT - \Delta f = fR$, this signal becomes a pseudo received signal coinciding with a received signal on their frequencies, and causes deterioration in the sensitivity of the receiver (deterioration in the spurious sensitivity). As a result of various investigations through basic experiments and simulations, it was found that the spurious sensitivity specification of mobile communication using the current CDMA system was, for example, satisfied sufficiently if the receiver top filter could realize about 20 to 25 dB attenuation in the transmitter band, as shown in FIG. 6.

The quantity of attenuation in the receiver band of the transmitter; top filter 12 is similarly defined with the following idea. The items fT, fR, $f_{sp}$ and $\Delta f$ are defined as described above. The transmitted power from the transmitter enters the transmitter-line SAW resonator filter. In addition, assume that a spurious signal (interfering wave) with $f_{sp} = fT + \Delta f$ comes in through the antenna. A pseudo received signal at the frequency $2fT - f_{sp} = fR$, that is, in the receiver band, is generated due to the 3rd-order nonlinear distortion of the switching element in the same manner as described above. This pseudo received signal passes through the transmitter top filter again and enter the receiver line to thereby cause deterioration in the sensitivity of the receiver likewise. It is therefore for the transmitter top filter to suppress the pseudo received signal. This defines the quantity of attenuation in the receiver band of the transmitter top filter. As a result of various investigations through basic experiments and simulations, it was found that the specification was satisfied sufficiently if the transmitter top filter could realize a value of 10 to 15 dB as shown in FIG. 6.

FIG. 6 shows frequency characteristics equal to or more relaxed than that of an antenna duplexer for use in a portable telephone of a current digital system. Since the frequency characteristics of FIG. 6 are relaxed drastically in comparison with that of FIG. 5, an antenna duplexer realized by use of background-art dielectric resonator filters as the top filters can be configured to be reduced in volume to about ⅓ of that in the case where the frequency characteristics of FIG. 5 are realized. When background-art SAW filters are used as the top filters, the antenna duplexer can be miniaturized on a larger scale as mentioned above in the paragraph of SUMMARY OF THE INVENTION.

Here, description will be made about the case where the frequency characteristic of FIG. 5 is realized only by using background-art SAW filters, for reference. There are various piezoelectric substrates for use in SAW filters, they are however limited to only a few kinds of substrates such as LiTaO$_3$, LiNbO$_3$, etc. for use in SAW filters in antenna duplexers or the like. Generally, such piezoelectric substrates have a temperature characteristic of −30 to −80 ppm/° C., which is a value several times as large as that of dielectric material such as ceramic or the like to be used for the above-mentioned dielectric resonator filter. Therefore, antenna duplexers developed up to now with such piezoelectric substrates were applicable only to portable telephones AMPS of the 800 MHz band having a gentle request for the frequency characteristics in the U.S., or portable telephones in the above-mentioned digital system likewise having a gentle request, as described above in the paragraph of Background Art. The frequency characteristics of FIG. 5, which are broad in each of the transmitter and receiver bandwidths and narrow in the guard band, cannot be implemented by the background-art SAW filter technologies as long as a piezoelectric substrate superior in temperature characteristics is not found out in the future. On the other hand, in this embodiment, each of the transmitter-line and receiver-line filters is constituted by a top filter and a band-switchable SAW resonator filter which are connected in cascade. The SAW resonator filter is constituted by the combination of an SAW resonator and additive capacitance or inductance. The value of the capacitance or inductance is changed over by a switching element so that the pass band or the Attenuation band is switched. As a result, even if a conventional piezoelectric substrate is used, it is possible to equivalently realize the frequency characteristic requested in FIG. 5, which is otherwise extremely difficult to be realized.

Figure 7A:
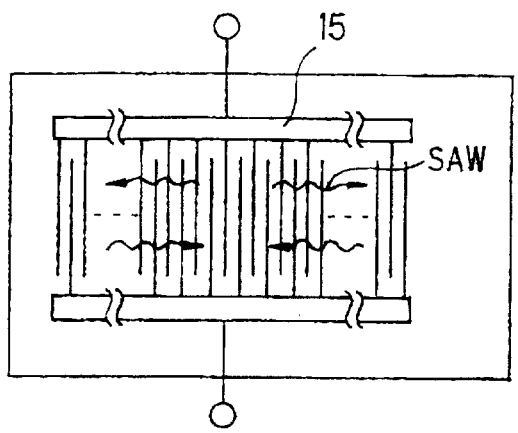
FIG. 7A and 7B are configuration views of an SAW resonator.
Figure 7B:
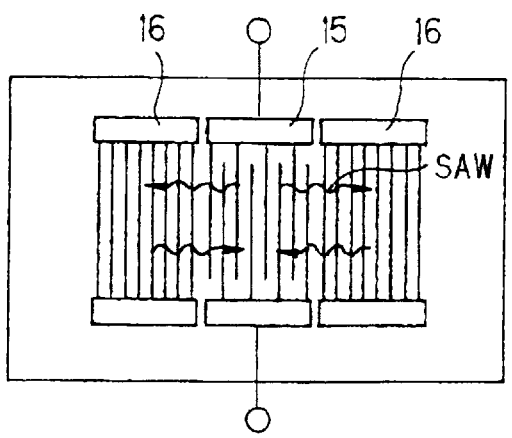
Figure 7C:
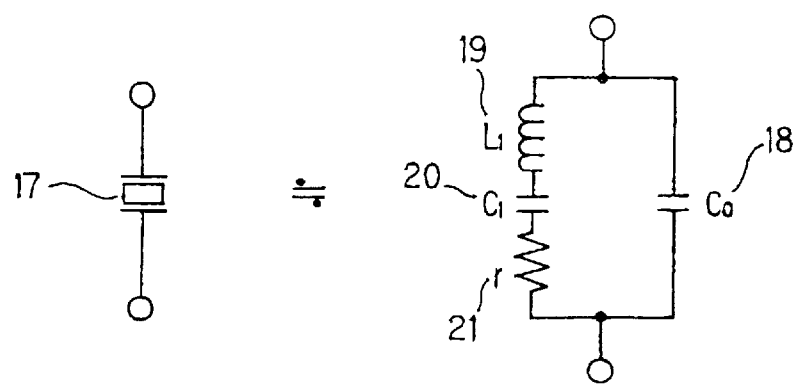
FIG. 7C is an equivalent circuit diagram of the SAW resonator.

Next, description will be made about the SAW resonator filter. FIGS. 7A and 7B show examples of the general configuration of an SAW resonator. FIG. 7A shows an IDT-type resonator constituted by an IDT (Interdigital Transducer) 15 formed of a very large number of pairs of electrode fingers. FIG. 7B shows a reflector-type resonator in which reflectors 16 formed of a large number of pairs of electrode fingers are similarly disposed on opposite sides of an IDT 15. FIG. 7C shows the symbolized SAW resonator 17 and its simplified equivalent circuit. The symbol $C_0$ 18 represents electrostatic capacitance between electrode fingers, and $L_1$ 19, $C_1$ 20 and r21 represent equivalent inductance, equivalent capacitance and equivalent resistance generated by resonance. On the assumption that the impedance of the resonator of FIG. 7C is Z, its imaginary part has a frequency characteristic shown in FIG. 7D. That is, the imaginary part has the relation of Im(Z)≈0 at the resonant frequency (fr), and Im(Z)≈∞ at the antiresonant frequency (fa). The frequency difference between the frequencies fr and fa depends on the piezoelectric effect (electromechanical coupling constant $k^2$) of the substrate to be used. The frequency difference is usually several % in the relative value (fa−fr)/fa. This means that the impedance of the resonator varies substantially from 0 to ∞ at a frequency interval of about several %. Using such a characteristic of the SAW resonator, the SAW resonator filter realizes extremely sharp frequency characteristics.

Figure 8B:
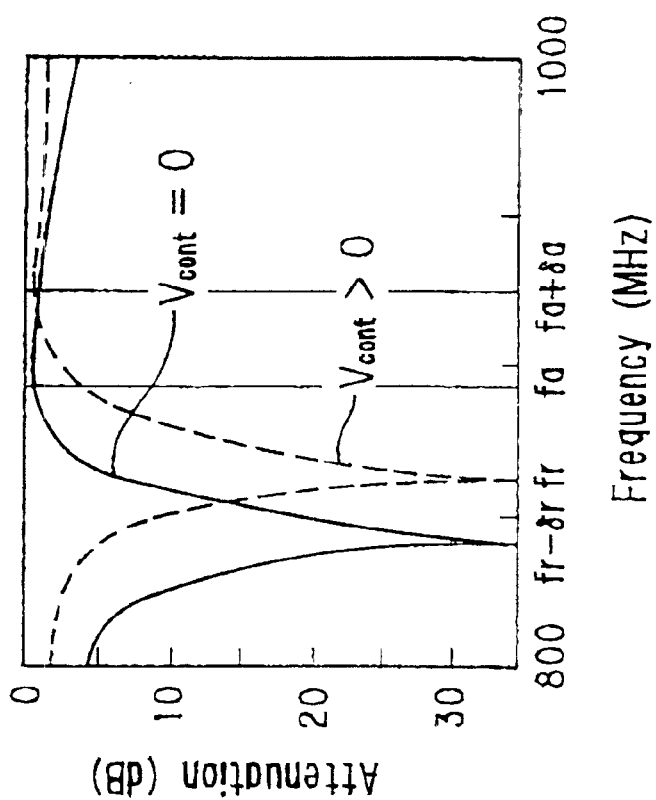
FIG. 8B is a diagram of frequency characteristics.
Figure 8A:
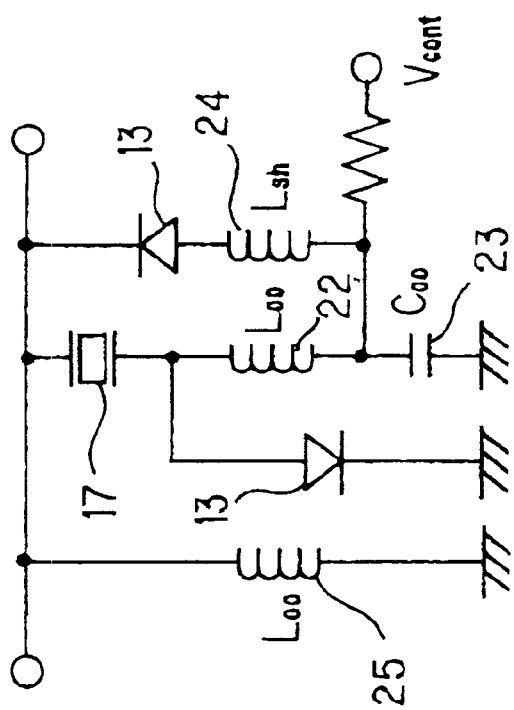
FIG. 8A is a block diagram of an SAW resonator filter portion using inductance as an external additive element.
Figure 9B:
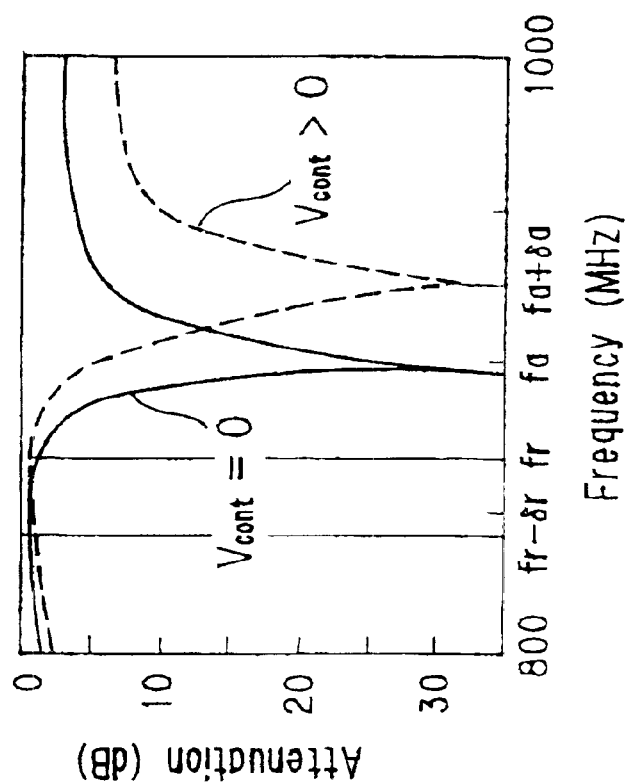
FIG. 9B is a diagram of frequency characteristics.
Figure 9A:
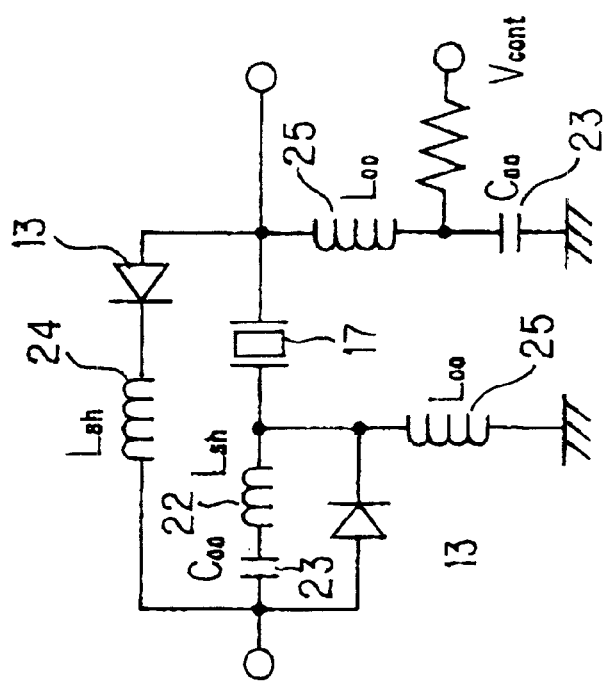
FIG. 9A is a block diagram of an SAW resonator filter portion using inductance as an external additive element.

FIGS. 8A and 9A show the transmitter-line and receiver-line SAW resonator filter portions of FIG. 4 respectively. FIGS. 8B and 9B show examples of their frequency characteristics. First, the transmitter-line SAW resonator filter will be explained with reference to FIGS. 8A and 8B. When Vcont=0 in FIG. 8A, a switching element 13 (which is a pin diode in FIG. 8A) is OFF. As a result, the circuit of FIG. 8A is equivalent to a circuit in which an element constituted by an SAW resonator 17 and external inductance Lse 22 added in series to the former is introduced into a parallel arm between a signal line and the earth through a bypass capacitor C∞ 23. Another external inductance Lsh 24 does not affect the characteristic of the filter because the switching element 13 is OFF. External inductance L∞ 25 is provided for feedback of a control current and its impedance is ideally ∞.

The parallel arm impedance is provided by the serial connection impedance of Z and Lse, that is, Z+jωLse. As a result, with reference to FIG. 7D, the relation of Im(Z+jωLse)≈0 is established at the frequency fr−δr slightly lower than fr. This frequency is an attenuation pole of the filter on the condition of Vcont=0 as shown by the solid line in FIG. 8B.

Figure 7D:
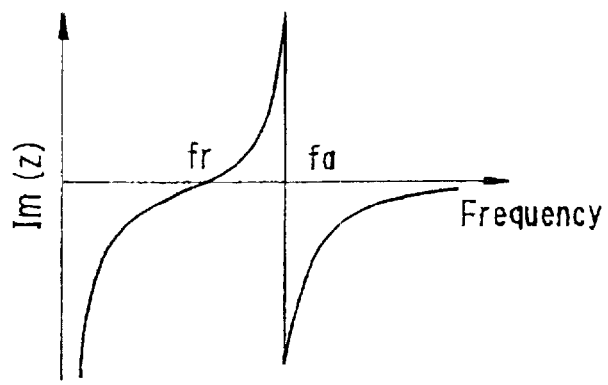
FIG. 7D is a diagram of impedance characteristics of the SAW resonator.

With reference to FIG. 7D, the relation of Im(Z+jωLse)≈∞ is provided by the frequency fa independently of Les. Therefore, the vicinities of this frequency are a pass band of the filter as shown by the solid line in FIG. 7B.

When Vcont>0 in FIG. 8A, the switching element 13 is ON. In this case, the parallel arm impedance between the signal line and the earth is provided by the parallel connection impedance of Z and Lsh, that is, Z∥Lsh(=jωLshZ/(Z+jωLsh)). Therefore, with reference to FIG. 7D, the relation of Im (Z∥Lsh )≈0 is provided by the frequency fr independently of Lsh. This frequency is an extreme of attenuation in the filter on the condition of Vcont>0 as shown by the dotted line in FIG. 8B. On the other hand, with reference to FIG. 7D, the relation of Im(Z∥Lsh )≈∞ is established at a frequency fa+δa which is a little higher than the frequency fa. The vicinities of this frequency are a pass band of the filter on the condition of Vcont>0 as shown by the dotted line in FIG. 8B.

Figure 10A:
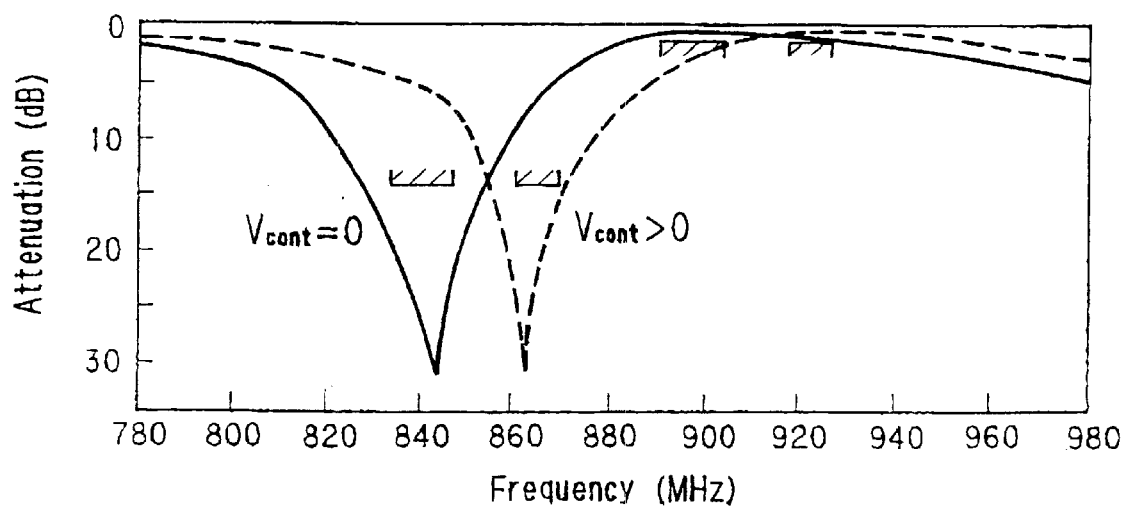
FIG. 10A is a diagram of frequency characteristics of a transmitter-line SAW resonator filter of a J-CDMA mobile radio terminal antenna duplexer.

FIG. 8B shows that the pass band and the attenuation band can be paired up and changed over by the control of Vcont. Generally, an SAW resonator filter has a feature to exhibit a sharp frequency characteristics with an attenuation pole in its attenuation band and a relatively broad and relaxed frequency characteristics in its pass band, as shown in FIG. 8B. FIG. 10A shows an example of the frequency characteristics of an SAW resonator filter which is realized in such a manner that the SAW resonator 17, the Lse 22, the Lsh 24, and so on in FIG. 8A, are optimized on the basis of the frequency characteristic of FIG. 8B, so that the frequency relations are matched to ensure a required quantity of attenuation. It is understood from FIG. 10A that there is realized a frequency characteristic in accordance with the conditions of Vcont=0 and Vcont>0, in which the low bands (fT(L) and fR(L)) and the high bands (fT(H) and fR(H)) of the transmitter and receiver bands (fT and fR) are paired up, and a pass band and an attenuation band are provided in the low band and high band respectively.

Next,the receiver-line SAW resonator filter will be described with reference to FIGS. 9A and 9B. When Vcont=0 in FIG. 9A, the switching element 13 is OFF. Therefore, the circuit of FIG. 9A is equivalent to a circuit in which an element constituted by the SAW resonator 17 and external inductance Lse 22 added in series to the former is introduced into a serial arm of a signal line through a bypass capacitor C∞ 23. The serial arm impedance is provided by the serial connection impedance of Z and Lse, that is, Z+jωLse. As a result, the vicinities of the frequency fr− δ r where the imaginary part of the impedance is zero, that is, the relation of Im(Z+jωLse) ≈0 is established, are a pass band of the filter on the condition of Vcont=0 as shown by the solid line in FIG. 8B. On the contrary, the frequency where the relation of $Im(Z+j\omega Lse) \approx \infty$ is established, that is, the frequency fa is an extreme of attenuation in the filter.

When Vcont>0, the switching element 13 is ON. In this case, the serial arm impedance is provided by the serial connection impedance of Z and Lsh, that is, Z∥Lsh. As a result, the vicinities of the frequency fr where the imaginary part of the impedance is zero, that is, the relation of $Im(Z\|Lsh) \approx 0$ is established, are a pass band of the filter on the condition of Vcont>0 as shown by the dotted line in FIG. 9B. On the contrary, the frequency where the relation of $Im(Z\|Lsh) \approx \infty$ is established, that is, the frequency fa+δ a is an extreme of attenuation in the filter The above-mentioned relationship is opposite to the relationship of FIG. 8B. That is, the vicinities of the attenuation pole in FIG. 8B correspond to the pass band in FIG. 9B, and conversely the vicinities of the attenuation pole in FIG. 9B correspond to the pass band in FIG. 8B. These facts can be understood easily also from the fact that the circuit configuration of FIG. 8A has substantially opposite relation to that of FIG. 9A.

Figure 10B:
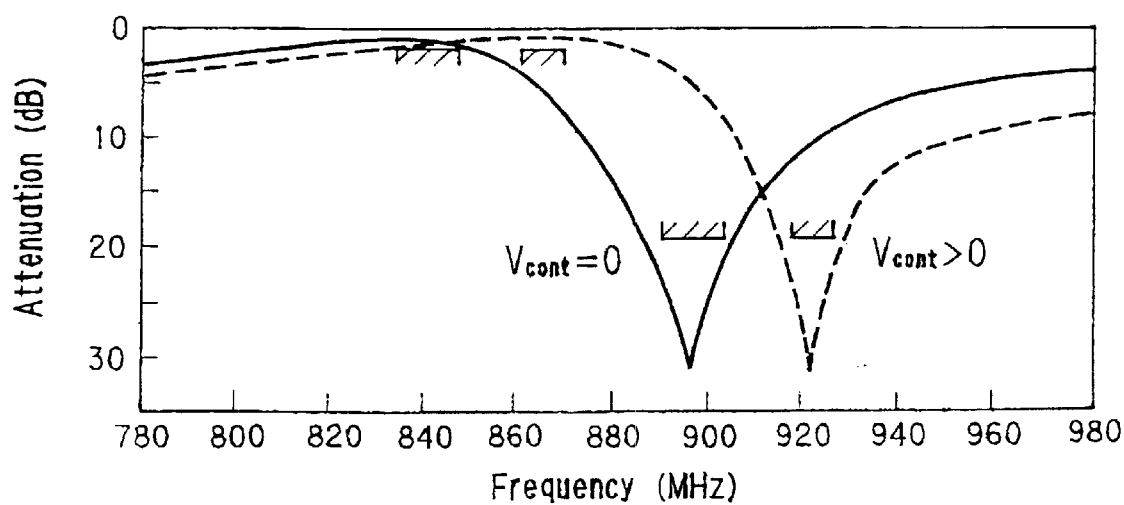
FIG. 10B is a diagram of frequency characteristics of a receiver-line SAW resonator filter portion of the J-CDMA mobile radio terminal antenna duplexer.

FIG. 10B shows an example of the frequency characteristic of an SAW resonator filter in which the SAW resonator 17, the Lse 22, the Lsh 24 and so on in FIG. 9A are optimized on the basis of the frequency characteristics of FIG. 9B so that the frequency relations are matched to ensure a required quantity of attenuation. It is understood from FIG. 10B that there is realized frequency characteristisc in which in accordance with the conditions of Vcont=0 and Vcont>0, the low bands (fT(L) and fR(L)) and the high bands (fT(H) and fR(H)) of the transmitter and receiver bands (fT and fR) are paired up and a pass band and an attenuation band are provided in the low band and the high band respectively.

Although the additive inductance itself is changed over by the switching element in FIGS. 8A and 9A, for example, the inductance may be divided into a plurality, and a part of the plurality be changed over by switching so as to control the inductance value as a whole. In this case, finer control can be achieved in terms of the frequency characteristics.

Figure 11A:
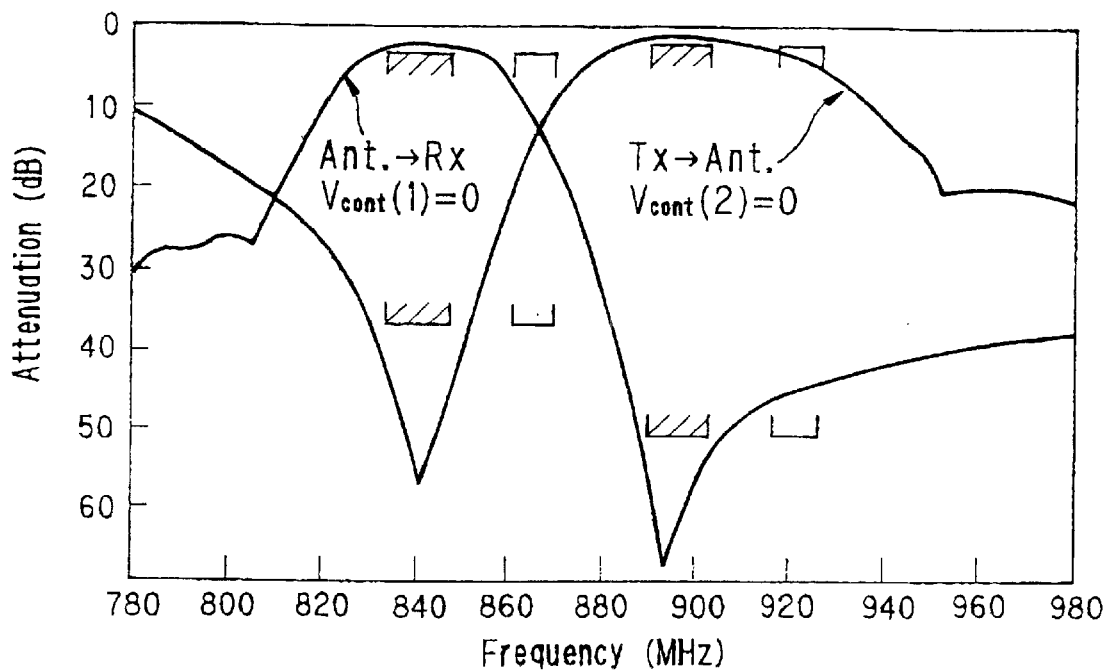
FIG. 11A is a diagram of frequency characteristics on the side of a low band of a J-CDMA mobile radio terminal antenna duplexer according to the present invention.
Figure 11B:
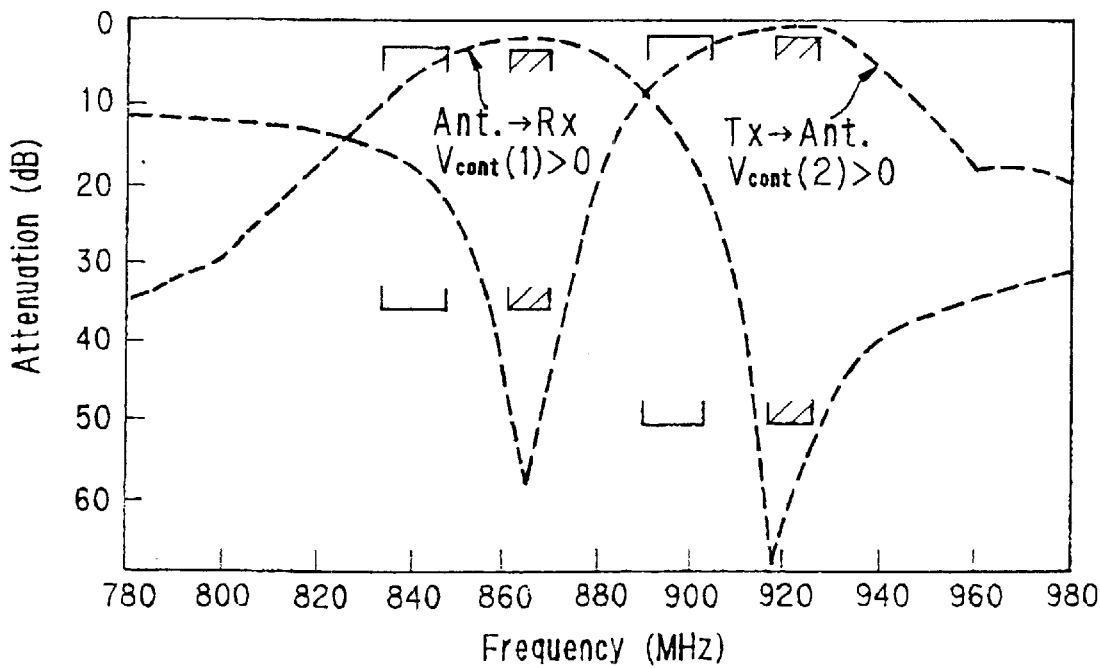
FIG. 11B is a diagram of characteristics on the side of a high band of the J-CDMA mobile radio terminal antenna duplexer according to the present invention.

The top filters and the SAW resonator filters of the respective transmitter and receiver lines in FIG. 4 have been described. Description will be made below about the total characteristics of the transmitter-line and receiver-line filters. FIGS. 11A and 11B show frequency characteristics between each terminal for the transmitter and the receiver and the terminal for the antenna when the top filters and the SAW resonator filters are connected to each other as shown in FIG. 4. FIG. 11A shows the case where the relation of Vcont(1)=Vcont(2)=0 is established, each low band of the transmitter and receiver bands being corresponding to a pass band or an attenuation band. FIG. 11B shows the case where the relations of Vcont(1)>0 and Vcont(2)>0 are established, each high band of the transmitter and receiver bands being corresponding to a pass band or an attenuation band. The frequency characteristic of FIGS. 11A and 11B is equal to the frequency characteristic required of the antenna duplexer in FIG. 5, in terms of loss in the pass band, an attenuation quantity in the attenuation band, and so on. That is, a radio terminal using the antenna duplexer according to the present invention can ensure the performance equal to that of a terminal using the antenna duplexer having the characteristic of FIG. 5, in the point of view of the system.

Figure 2:
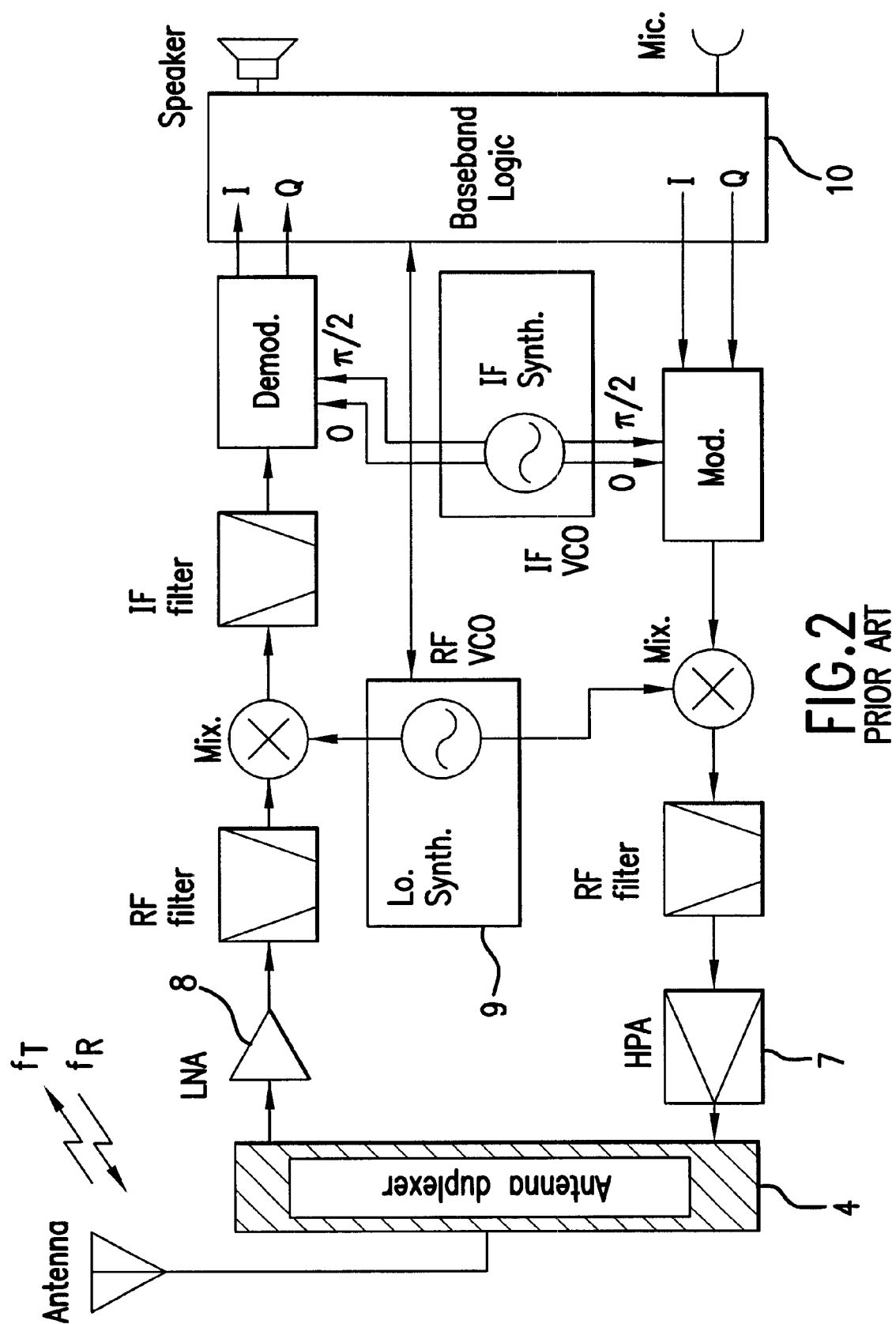
FIG. 2 is a circuit block diagram of a mobile radio terminal.

Here, description will be made about switching between the low band and the high band. Generally in the radio terminal such as a portable telephone or the like shown in FIG. 2, as soon as the power is turned on, a control channel transmitted at a specific frequency from a base station is demodulated so that the existence of information such as a call or the like concerned with the terminal is monitored. When a talk channel is connected between the terminal and the base station by an incoming call or an outgoing call, the base station can assign desirable frequencies in the transmitter and receiver bands to the terminal in accordance with the circuit situation. This frequency assignment information is converted into a control signal for a synthesizer 9 by a base-band/logic circuit 10 of the terminal as shown in FIG. 2 so that a local signal is set to be at a predetermined frequency. Since the base-band/logic circuit grasps all the frequency information, it is extremely easy to generate a control voltage for switching so as to meet Vcont=0 when the talk channel is in the low band and Vcont>0 when it is in the high band. It is therefore obvious that the band-switchable antenna duplexer having the characteristics as shown in FIGS. 11A and 11B can provide performance substantially equal to that of the antenna duplexer as shown in FIG. 5.

Next, description will be made about the relationship between frequency characteristics of the top filters and the SAW resonator filters of the transmitter and receiver lines shown in FIG. 6 and FIGS. 10A and 10B and the total characteristics of the transmission-line and receiver-line filters in FIG. 11A. It is generally considered that when two kinds of filters are connected in cascade, the loss and the attenuation quantity in the pass band are provided on the basis of the sum of losses and the sum of attenuation quantities in the respective filters, respectively. However, as a result that the relationship between the impedance characteristics and the total frequency characteristics in each filter were researched in detail, it was found that the impedance of each filter viewed from the cascade connection point had a great influence on the total frequency characteristics after the connection, particularly on the quantity of attenuation.

Figure 12A:
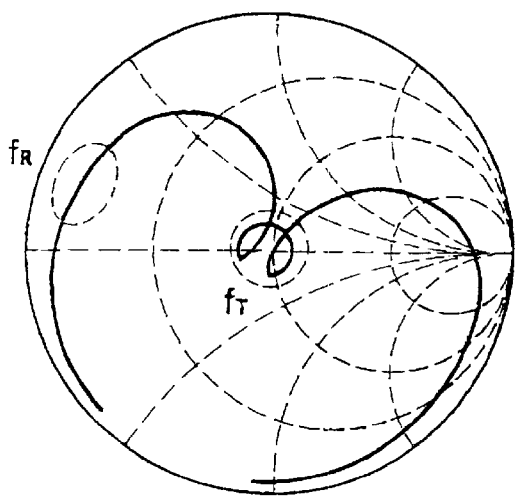
FIG. 12A is a Smith chart of impedance of a top filter of a transmitter-line filter viewed from a cascade connection point.
Figure 12B:
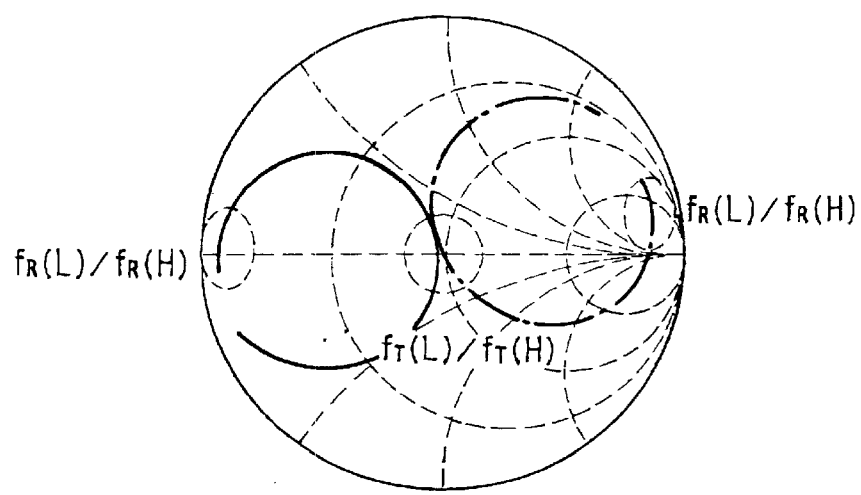
FIG. 12B is a Smith chart of impedance of an SAW resonator filter portion of the transmitter-line filter viewed from the cascade connection point.

FIGS. 12A and 12B are Smith charts respectively showing impedances of the transmitter top filters and the SAW resonator filter in the transmitter-line filter of FIG. 4 viewed from the cascade connection point by way of example. It is understood from FIG. 12A that the impedance of the top filter is low in the receiver band (fR) while it is about 50 Ω in the transmitter band (fT). On the other hand, the impedance of the SAW resonator filter is also about 50 Ω in fT, but the attenuation in fR is formed by that the imaginary part of the parallel arm impedance is substantially zero, so that the SAW resonator filter has a low resistive impedance in fR as shown by the solid line in FIG. 12B. Here, when the top filter and the SAW resonator filter were actually connected directly in cascade, it was found that the loss in the pass band was substantially equal to the sum of losses in the respective filters, but the quantity of attenuation in fR was decreased by about 5 dB in comparison with the sum of the attenuation quantities in the respective filters. It is considered that the reason was that both the top filter and the SAW resonator filter had a low impedance close to resistance in fR, and the condition for impedance matching was established at the connection point so that the quantity of attenuation was reduced conversely.

Next, a phase shift circuit, that is, a phase shifter 14 was inserted between the top filter and the SAW resonator filter as shown in FIG. 4. That is, the phase was rotated on the Smith chart so that the impedance of the SAW resonator filter viewed through the phase shifter 14 was converted into the impedance shown by the one-dot chain line in FIG. 12B. As understood from FIG. 12B, high impedance was achieved in fR while the impedance was kept about 50 Ω in fT. When the top filter and the SAW resonator filter were connected in cascade through the phase shifter 14 on this condition, it was found that the quantity of attenuation in fR was increased by about 5 dB in comparison with the sum of the attenuation quantities in the respective filters while the loss in the pass band was substantially equal to the sum of losses in the respective filters. It is considered that the reason was that very large impedance mismatch was generated in fR between the top filter and the SAW resonator filter so as to increase the quantity of attenuation.

Figure 12C:
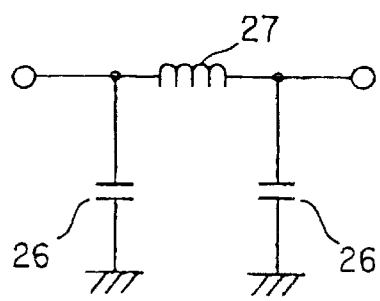
FIGS. 12C an 12D are block diagrams of phase shifters.
Figure 12D:
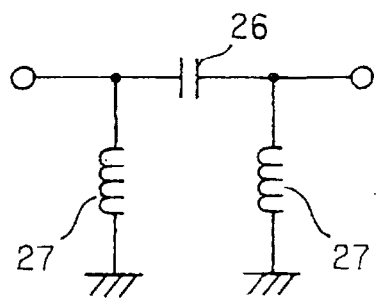

FIGS. 11A and 11B show frequency characteristics including a phase shifter. It was confirmed that a π- or T-circuit of capacitance 26 and inductance 27 was satisfactory as the circuit configuration of the phase shifter, as shown in FIGS. 12C and 12D. In addition, if lumped-constant elements such as a chip capacitor, a chip inductor, and so on, are used for the capacitance and the inductance, such a phase shifter can be realized in an extremely small size. However, it should be noted that the effect of the phase shifter depends on the impedance relationship between the top filter and the SAW resonator filter, and the effects are great In some cases and a little in other cases. Not to say, the phase shifter is dispensed with in the latter cases.

This embodiment was described in connection with an inventive example in which the frequency allocation of the J-CDMA system in Japan provided in FIG. 3A was used by way of example, and the antenna duplexer having a very sharp frequency characteristics provided in FIG. 5 was realized in the form of a small-sized antenna duplexer having an equivalent frequency characteristics shown in FIGS. 11A and 11B. A background-art dielectric resonator filter is so large in volume as to place hurdles on the miniaturization of the terminal itself. In addition, such frequency characteristics itself cannot be realized in the background-art SAW filter technology because of the temperature characteristics of a piezoelectric substrate at present. On the basis of the configuration of FIG. 4, it is intended in this embodiment that the miniaturization of an antenna duplexer and such frequency characteristics are made compatible by the introduction of a small-sized band-switchable SAW resonator filter. In addition, although this embodiment is described in connection with an example where an SAW resonator filter is introduced to each of the transmitter-line and receiver-line filters, it is obvious that a similar effect can be obtained if it is introduced to only one of the transmitter-line and receiver-line filters.

Embodiment 2

Figure 3B:
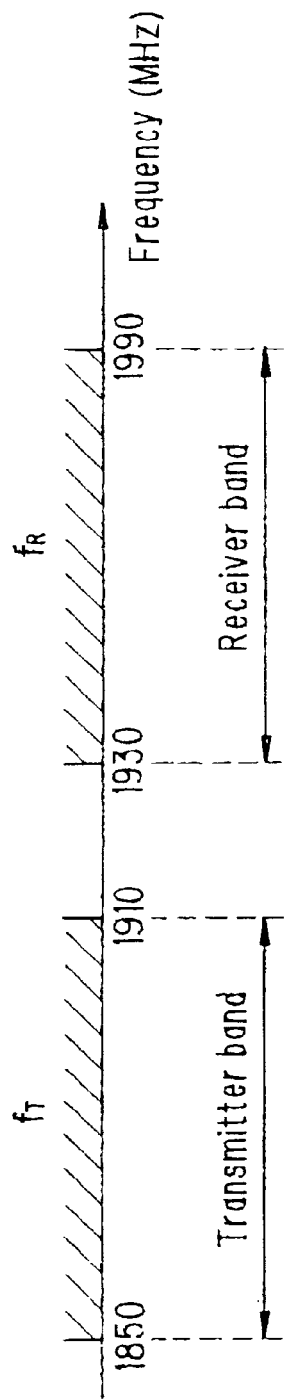

Description will be made in connection with the case of the PCS system in the U.S. in FIG. 3B. The system is different from the J-CDMA system in Japan so far as the transmitter and receiver frequencies (fT and fR) are arranged inversely and fT is lower than fR. In addition, each of fT and fR is not constituted by a low band and a high band but the whole band of 60 MHz is used for each of fT and fR.

In order to realize an antenna duplexer for use in the present invention, first, each 60 MHz of fT and fR is virtually divided into two of 30 MHz. The lower part of the two is regarded as a low band (fT(L)=1,850 to 1,880 MHz, $f_R$(L)=1,930 to 1,960 MHz), and the upper part is regarded as a high band (fT(H)=1,880 to 1,910 MHz, $f_R$(H)=1,960 to 1,990 MHz). If the configuration of FIG. 4 according to the present invention is under the condition that the transmitter terminal and the receiver terminal are exchanged for each other while the antenna is not changed as it is, a small-sized antenna duplexer can be realized in the same manner, as in the case of J-CDMA. However, since the low band is continuous to the high band, generally, it is necessary to design the attenuation band of each SAW resonator filter to be slightly wider than that for J-CDMA so that the low band overlaps with the high band partially. Nevertheless the relative bandwidth is 30 MHz/1865 MHz=1.6086% even in the low band of the transmitter band having the widest bandwidth relative to its center frequency, and it is smaller than the relative bandwidth of the lower band of the receiver band in J-CDMA, which is 14 MHz/839 MHz=1.6687%. Therefore, there is no especially great problem in the design of SAW resonators for SAW resonator filters, and a small-sized antenna duplexer can be realized according to the present invention in the same manner as in Embodiment 1.

Embodiment 3

Description will be made about an example of the configuration of the SAW resonator filter with reference to the impedance characteristics of the SAW resonator in FIG. 7D. If serial capacitance (Cse) or serial inductance (Lse) is added to the exterior of the SAW resonator, the antiresonant frequency (fa) does not change, but the resonant frequency (fr) shifts to a higher frequency (fr+δ r) when the capacitance is added, or to a lower frequency (fr−δ r) when the inductance is added. If parallel capacitance (Csh) or parallel inductance (Lsh) is added to the exterior of the SAW resonator, the resonant frequency (fr) does not change, but the antiresonant frequency (fa) shifts to a lower frequency (fa−δ a) when the capacitance is added, or to a higher frequency (fa+δ a) when the inductance is added.

Figure 13B:
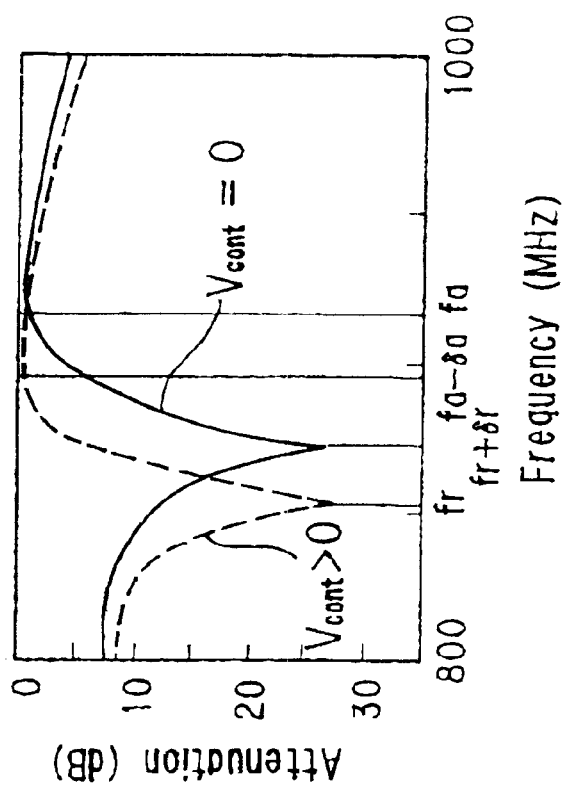
FIG. 13B is a frequency characteristic diagram.
Figure 13A:
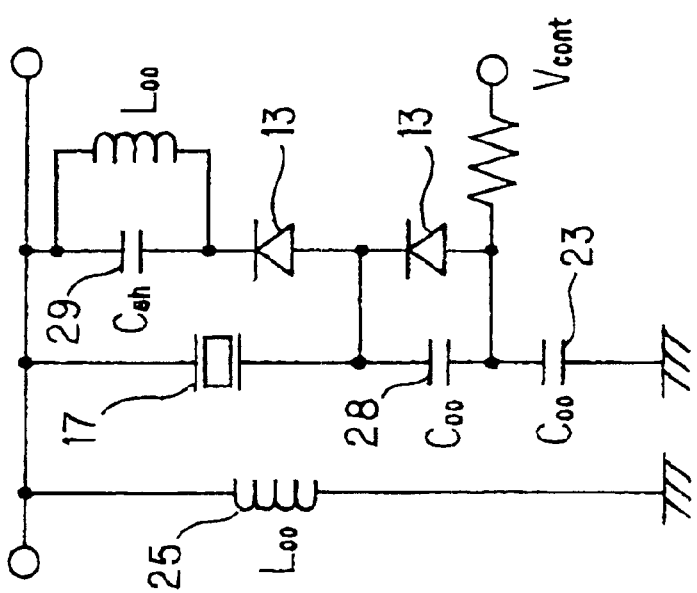
FIG. 13A is a block diagram of an SAW resonator filter portion using capacitance as an external additive element.
Figure 14B:
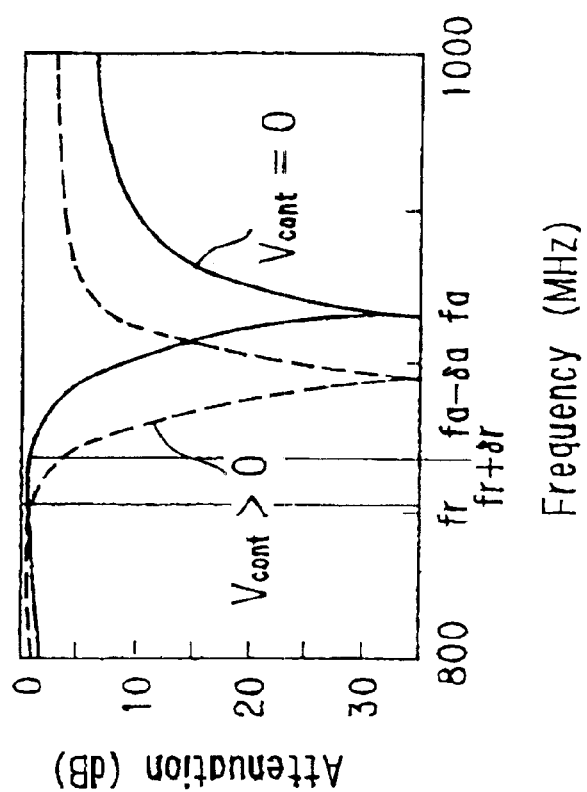
FIG. 14B is a diagram of frequency characteristics.
Figure 14A:
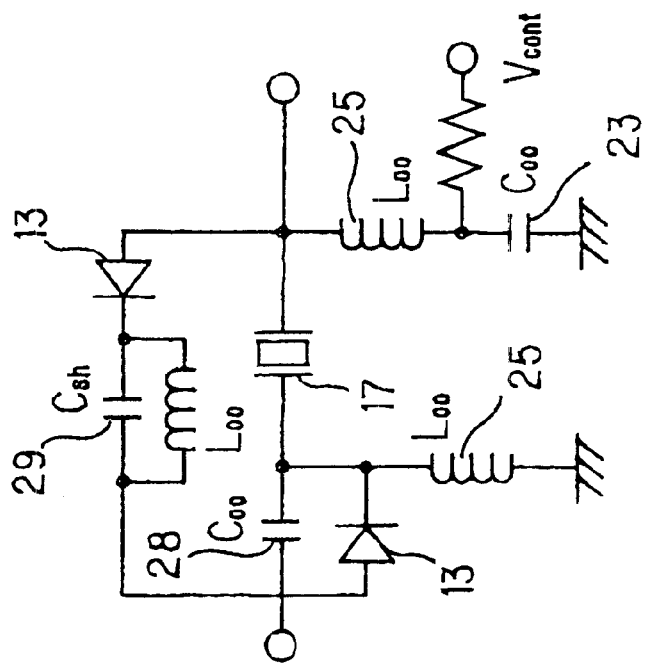
FIG. 14A is a block diagram of an SAW resonator filter portion using capacitance as an external additive element.

FIGS. 8A and 8B and FIGS. 9A and 9B show examples of circuit configuration of SAW resonator filters using inductance as an additive eletment on the basis of the above-mentioned principle. These examples were described in detail in (Embodiment 1). FIGS. 13A and 13B and FIGS. 14A and 14B show examples of circuit configuration of SAW resonator filters using capacitance as an additive element in the same manner. FIGS. 13A and 14A show circuits, and FIGS. 13B and 14B show the frequency characteristics of the filters.

In FIG. 13A, on the condition of Vcont=0, the switching element 13 is OFF. As a result, the filter is configured such that a series of Z and Cse 28, that is, Z+1/jωCse is introduced into a parallel arm between a signal line and the earth. Thus, an extreme of attenuation of the filter is generated at a frequency fr+δ r which is a little higher than fr, as shown by the solid line in FIG. 13B. Since the antiresonant frequency does not change, the pass band of the filter is kept near fa as shown by the solid line In the same manner. On the other hand, in FIG. 13A, on the condition of Vcont>0, the switching element 13 is ON . As a result, the filter is configured such that a parallel of Z and Csh 29, that is, Z‖Csh=Z/(1+JωCshZ) is introduced Into the parallel arm. Thus, since the resonant frequency deos not change, an extreme of attenuation of the filter is generated at the frequency fr as shown by the dotted line in FIG. 13B, and the pass band comes near a frequency fa−δ a which is a little lower than fa.

In FIG. 14A, on the condition of Vcont=0, the switching element 13 is OFF. As a result, the filter is configured such that Z+1/jωCse is introduced into a serial arm of the signal line. Thus, since the antiresonant frequency does not change, an attenuation pole is provided by fa as shown by the solid line in FIG. 14B, and the pass band of the filter comes near a frequency fr+δ r which is a little higher than fr. On the condition of Vcont>0, the switching element is ON. As a result, the filter is configured such that Z‖Csh is introduced into the serial arm. Thus, an attenuation pole of the filter is provided by a frequency fa−δ a which is a little lower than fa as shown by the dotted line in FIG. 14B. Since the pass band comes near fr because the resonant frequency does not change.

It is understood that a band-switchable SAW resonator filter can be realized if an SAW resonator is used as a basic circuit element while either capacitance (FIGS. 13A and 13B and FIGS. 14A and 14B) or inductance (FIGS. 8A and 8B and FIGS. 9A and 9B) is used as an external additive element as described above. Not to say, it is obvious that capacitance and inductance may be combined, and it is not necessary to limit the number of SAW resonators to one, but cases where a plurality of SAW resonators are used, and further cases where a plurality of switching elements are used, also belong to the scope of the present invention. In addition, capacitance maybe divided into a plurality in the same manner as in the case of inductance, and a part of the plurality be changed over by switching, so that finer control can be achieved in terms of frequency.

Embodiment 4

Figure 15:
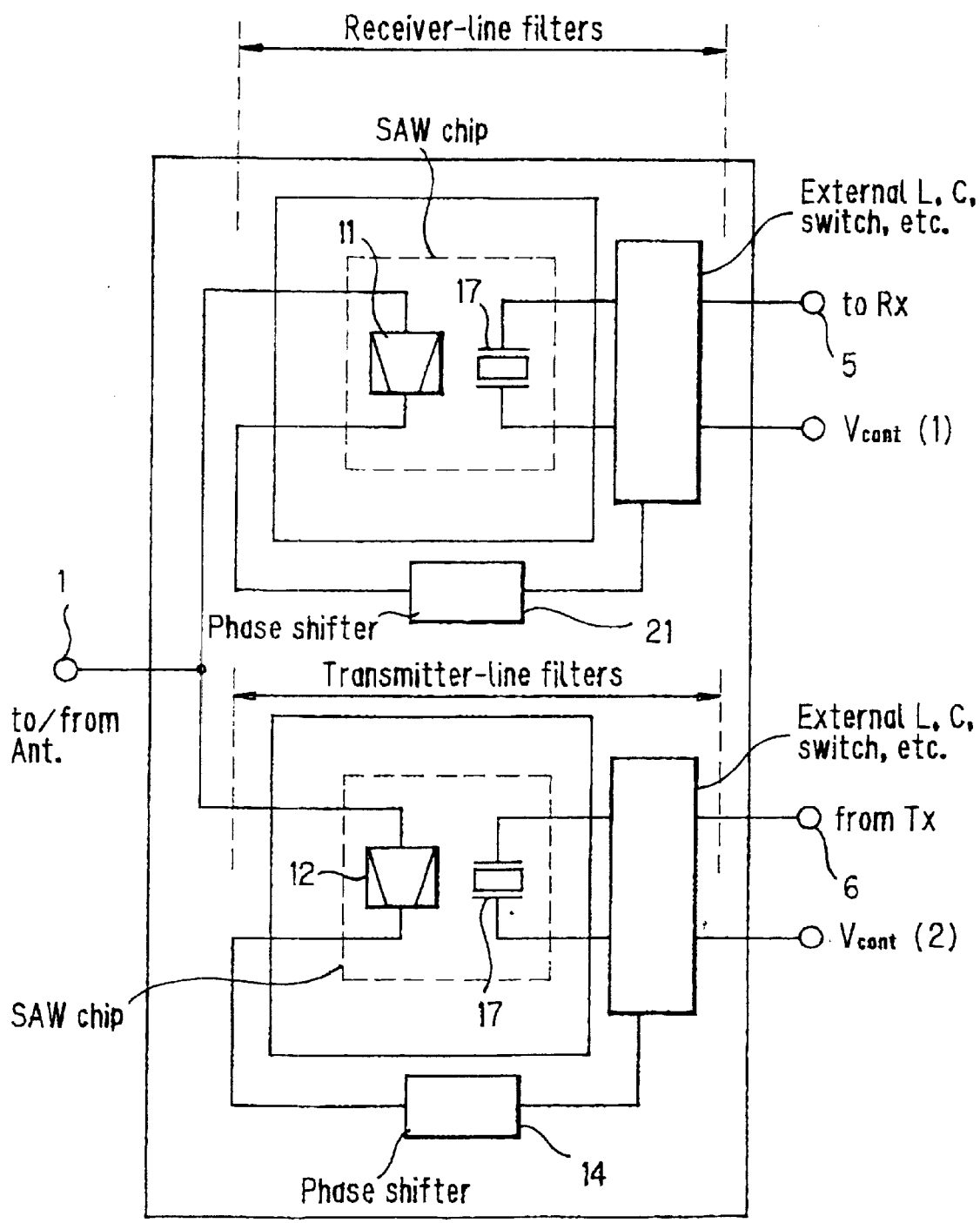
FIG. 15 shows an example of specific configuration view of the antenna duplexer according to the present invention.

Description will be made about a specific method for producing a small-sized antenna duplexer. FIG. 15 shows an example of specific configuration of the antenna duplexer in FIG. 5. The transmitter-line filters, that is, both the transmitter top filter and the SAW resonator filter are formed of SAW filters. These two filters may be formed in the form of separate SAW chips or in the form of a single SAW chip. Further, these chips may be mounted in a single package according to circumstances.

Figure 16A:
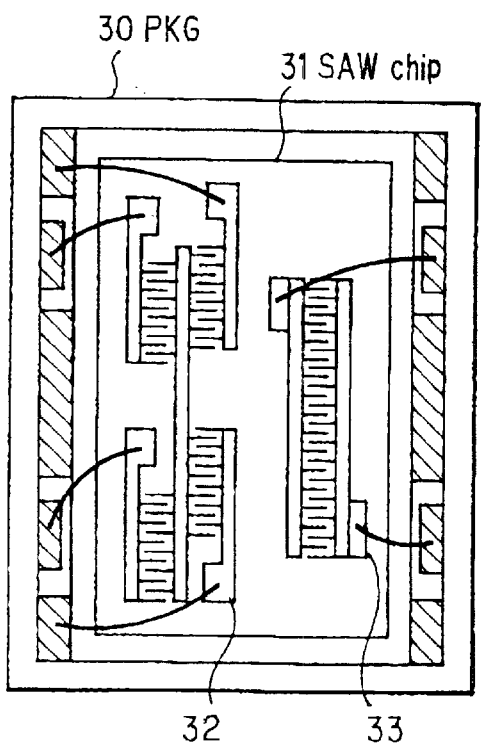
FIG. 16A is a top view in which SAW chips are mounted in a single package.
Figure 16B:
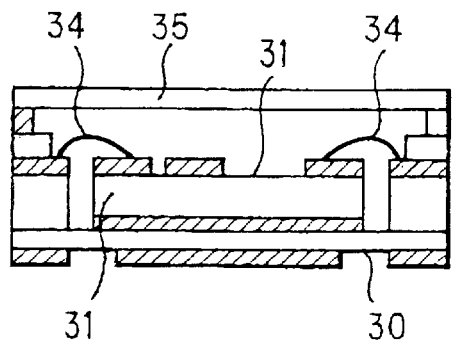
FIG. 16B is a sectional view of FIG. 16A.

FIGS. 16A and 16B show an example of a specific method for mounting the filters in a single chip 31 or in a single package. FIG. 16A is a top view in which a cover of the package is removed, and FIG. 16B is a sectional view. As shown in FIG. 16A, the left half of the SAW chip is a top filter portion 32, and the right half is an SAW resonator 33 for the SAW resonator filter. The same result will be met if the top filter and the SAW resonator are formed in different chips and the chips are mounted in the single package 30. FIG. 16B shows an example in which the SAW chip is connected to a signal pad or an earth pad of the package through a bonding wire 34. Here, it is not always necessary to use wire bonding for the connection, but there can be adopted other connection methods such as bump bonding, and so on, by which the package can be made smaller and thinner. The same fact can be said of the receiver-line filters, that is, the receiver top filter and the SAW resonator filter, and they can be formed in a single chip or in a single package.

Figure 17A:
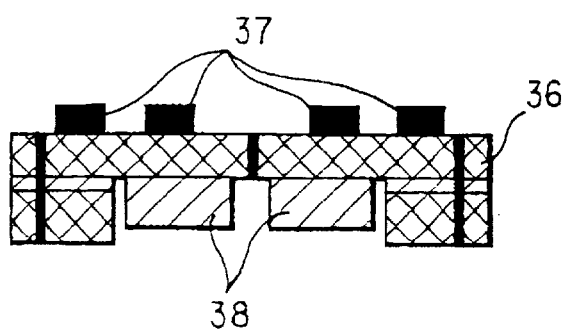
FIG. 17A is a sectional view of an example of an antenna duplexer module using an SAW filter mounted in a package according to the present invention.
Figure 17B:
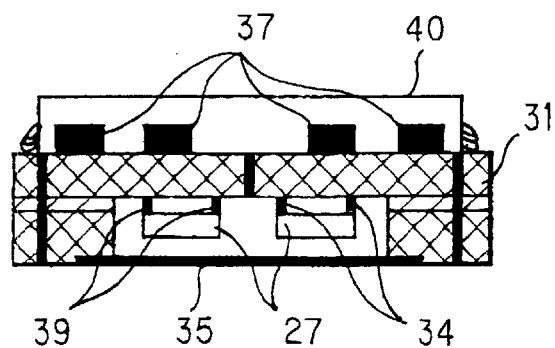
FIG. 17B is a sectional view of an example of an antenna duplexer module in which SAW chips are mounted by bump bonding according to the present invention.

FIGS. 17A and 17B show the more specific examples of the block diagram of FIG. 15, in the form of sectional views. In FIG. 17A, a pocket-like space is formed in a back surface of a base substrate 36 of a module of glass/epoxy, ceramic, or the like, and an SAW filter 38 mounted in the package in FIGS. 16A and 16B is fixed to the space portion from under the base substrate 36 by soldering or the like. Further, parts 37 such as a switching element, capacitance, inductance, etc. are mounted on an upper surface of the base substrate 36, and an upper portion of the module is further covered with a casing 40 or the like if necessary. The filter portion is miniaturized by using SAW, and there is adopted a so-called double-sided mounting technique in which the SAW filter and the SAW resonator mounted in the single package are mounted on the lower surface of the base substrate while parts 37 such as the switching element, the external additive element, etc. are mounted on the upper surface. Thus, it is possible to realize a micro-miniaturized antenna duplexer module. On the other hand, in FIG. 17B, not a SAW filter mounted in a package but an SAW chip 31 is fixed directly to a space portion of a base module 36 of the module from under through bump bonding 39. FIG. 17B shows a state where a cover 35 is put on the lower most surface of the module in order to keep the air tightness. Parts 37 such as a switching element, an external additive element, etc. are mounted on an upper portion of the module similarly to the configuration of FIG. 17A. FIG. 17B shows a case where the upper portion of the module is further covered with a casing. The module can be further miniaturized because of provision of the bump bonding 39 of the SAW chip 31 in comparison with FIG. 17A. Not to say, various combination in which the SAW chip and the base substrate are connected, for example, by wire bonding in FIG. 17B can be made as middle mounting methods between FIGS. 17A and 17B.

Although the above embodiments illustrate the SAW filter configuration in which only one SAW resonator is used as shown in FIGS. 8A and 9A and FIGS. 13A and 14A, an SAW resonator filter can be constituted by use of a plurality of SAW resonators in the same manner. For example, if a plurality of configurations of FIG. 8A, FIG. 9A, FIG. 13A or FIG. 14A are connected in cascade, a higher quantity of attenuation can be attained. Alternatively, if the configurations of FIGS. 8A and 13A or FIGS. 9A and 14A are combined with each other, design can be made with high degree of freedom with respect to the pass band and the attenuation band. Further, frequency characteristics having attenuation poles both on the low frequency side and on the high frequency side other than frequency characteristics having only an attenuation pole on the low frequency side or on the high frequency side can be realized by the combination of the configurations of FIGS. 8A and 9A or FIG. 14A, the combination of the configurations of FIGS. 9A and 13A, the combination of the configurations of FIGS. 13A and 14A, and so on. It is obvious that these configurations also belong to the scope of the present invention.

As shown in FIG. 2, in a current mobile radio terminal for the CDMA system or the like, devices other than an antenna duplexer, an HPA, a VCO, etc. come in course of being made into LSIs. Particularly, the fact is that an antenna duplexer using background-art dielectric resonators is large both in volume and in weight. Since such an antenna duplexer can be miniaturitzed extremely according to the present invention, the invention makes a large contribution to the miniaturization of a radio terminal as a whole. It is obvious that portable terminals or future card-type or wristwatch-type radio terminals which are mniniaturized by adopting the antenna duplexers according to the present invention also belong to the scope of the present invention.

As has been described with the embodiments, the present invention relates to an antenna duplexer for use in a system such as a recent portable telephone or the like in which each of the transmitter and receiver bandwidths is broad and the guard band between the transmitter and receiver bandwidths is narrow. In a dielectric resonator filter used in the background art, such a system was dealt with by increasing the number of stages of resonators. As a result, the volume of the antenna duplexer became so large as to place hurdles on the miniaturization of a terminal itself. According to the present invention, even such an antenna duplexer which is server in its requested specification can be micro-miniaturized and reduced in weight, and hence the invention makes a large contribution to the miniaturization of a radio terminal.

What is claimed is:

1. A surface acoustic wave antenna duplexer comprising a transmitter-line filter, a receiver-line filter and an antenna terminal, said transmitter-line filter and said receiver-line filter being connected in parallel with said antenna terminal as a common terminal;

wherein at least one of said transmitter-line and receiver-line filters includes a top filter using th e whole of a transmitter band or a receiver band as its pass band, a phase shift circuit, a surface acoustic wave resonator filter, and a transmitter or receiver terminal, said top filter, said phase shift circuit, said surface acoustic wave resonator filter and said transmitter or receiver terminal being disposed in this order viewed from said antenna terminal; and wherein said surface acoustic wave resonator filter includes at least one surface acoustic wave resonator and at least one additive capacitance or inductance, and a switching element is provided for varying a value of said capacitance or inductance so as to provide a function for varying a pass band frequency or an attenuation band frequency of said surface acoustic wave resonator filter.

2. A surface acoustic wave antenna duplexer comprising a transmitter-line filter, a receiver-line filter and an antenna terminal, said transmitter-line filter and said receiver-line filter being connected in parallel with said antenna terminal as a common terminal;

wherein at least one of said transmitter-line and receiver-line filters includes a top filter using the whole of a transmitter band or a receiver band as its pass band, a phase shift circuit, a surface acoustic wave resonator filter, and a transmitter or receiver terminal, said top filter, said phase shift circuit, said surface acoustic wave resonator filter and said transmitter or receiver terminal being disposed in this order viewed from said antenna terminal; and wherein said surface acoustic wave resonator filter includes at least one surface acoustic wave resonator and at least one additive capacitance or inductance, and a switching element is provided for varying a value of said capacitance or inductance so as to provide a function for varying a pass band frequency or an attenuation band frequency of said surface acoustic wave resonator filter; and wherein said phase shift circuit is constituted by at least one lumped-constant chip capacitance or coil inductance.

3. A surface acoustic wave antenna duplexer according to claim 1 or 2, wherein said top surface acoustic wave filter and said surface acoustic wave resonator for said surface acoustic wave resonator filter in each of said transmitter-line and receiver-line filters are mounted in a single package.

4. A surface acoustic wave antenna duplexer according to claim 3, wherein said antenna duplexer is provided as a double-side mounting module in which said top surface acoustic wave filter and said surface acoustic wave resonator are mounted on one surface of a base board for said antenna duplexer while said additive capacitance or inductance is mounted on the other surface of said base board.

5. A mobile radio terminal wherein a surface acoustic wave antenna duplexer according to claim 4 are mounted.

6. A mobile radio terminal according to claim 5, wherein a switching element of said surface acoustic wave antenna duplexer is turned on/off by a control signal supplied from a base band circuit so that a transmitter frequency or a receiver frequency of said mobile radio terminal is located in a pass band of a transmitter-line filter or a receiver-line filter of said surface acoustic wave antenna duplexer.

7. A mobile radio terminal wherein a surface acoustic wave antenna duplexer according to claim 3 are mounted.

8. A mobile radio terminal according to claim 7, wherein a switching element of said surface acoustic wave antenna duplexer is turned on/off by a control signal supplied from a base band circuit so that a transmitter frequency or a receiver frequency of said mobile radio terminal is located in a pass band of a transmitter-line filter or a receiver-line filter of said surface acoustic wave antenna duplexer.

9. A surface acoustic wave antenna duplexer according to claim 1 or 2, wherein said top surface acoustic wave filter and said surface acoustic wave resonator for said surface acoustic wave resonator filter in each of said transmitter-line and receiver-line filters are formed on a single chip.

10. A surface acoustic wave antenna duplexer according to claim 9, wherein said antenna duplexer is provided as a double-side mounting module in which said top surface acoustic wave filter and said surface acoustic wave resonator are mounted on one surface of a base board for said antenna duplexer while said additive capacitance or inductance is mounted on the other surface of said base board.

11. A mobile radio terminal wherein a surface acoustic wave antenna duplexer according to claim 9, are mounted.

12. A mobile radio terminal according to claim 11, wherein a switching element, of said surface acoustic wave antenna duplexer is turned on/off by a control signal supplied from a base band circuit so that a transmitter frequency or a receiver frequency of said mobile radio terminal is located in a pass band of a transmitter-line filter or a receiver-line filter of said surface acoustic wave antenna duplexer.

13. A mobile radio terminal wherein a surface acoustic wave antenna duplexer according to any one of claim 1 to 2 are mounted.

14. A mobile radio terminal according to claim 13, wherein a switching element of said surface acoustic wave antenna duplexer is turned on/off by a control signal supplied from a base band circuit so that a transmitter frequency or a receiver frequency of said mobile radio terminal is located in a pass band of a transmitter-line filter or a receiver-line filter of said surface acoustic wave antenna duplexer.

* * * * *